(12) United States Patent
Kawai

(10) Patent No.: US 11,145,810 B2
(45) Date of Patent: Oct. 12, 2021

(54) MEMORY DEVICE

(71) Applicant: TOSHIBA MEMORY CORPORATION, Tokyo (JP)

(72) Inventor: Hiroki Kawai, Inazawa Aichi (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 16/567,663

(22) Filed: Sep. 11, 2019

(65) Prior Publication Data

US 2020/0303637 A1    Sep. 24, 2020

(30) Foreign Application Priority Data

Mar. 20, 2019  (JP) .............................. JP2019-052230

(51) Int. Cl.
*H01L 45/00* (2006.01)
*H01L 27/24* (2006.01)

(52) U.S. Cl.
CPC .......... *H01L 45/06* (2013.01); *H01L 27/2409* (2013.01); *H01L 27/2463* (2013.01); *H01L 45/1253* (2013.01); *H01L 45/141* (2013.01); *H01L 45/148* (2013.01); *H01L 27/24* (2013.01); *H01L 27/249* (2013.01); *H01L 45/1233* (2013.01); *H01L 45/144* (2013.01)

(58) Field of Classification Search
CPC ... H01L 45/06; H01L 27/2409; H01L 45/141; H01L 45/1253; H01L 45/148; H01L 27/2463; H01L 27/24; H01L 45/144; H01L 45/1233; H01L 27/249
See application file for complete search history.

(56) References Cited

U.S. PATENT DOCUMENTS

| | | | |
|---|---|---|---|
| 5,187,052 A | 2/1993 | Maeda | |
| 8,598,563 B2 | 12/2013 | Sutou | |
| 8,861,254 B2 | 10/2014 | Gaillardon | |
| 2004/0233748 A1 | 11/2004 | Terao | |
| 2007/0070681 A1* | 3/2007 | Rohr | G11C 13/004 365/148 |

(Continued)

FOREIGN PATENT DOCUMENTS

| | | |
|---|---|---|
| EP | 0387898 A2 | 9/1990 |
| JP | S63-251290 A | 10/1988 |

(Continued)

OTHER PUBLICATIONS

V Carteaux et al., "Crystallographic, magnetic and electronic structures of a new layered ferromagnetic compound $Cr_2Ge_2Te_6$", Journal of Physics: Condensed Matter (vol. 7, No. 1), 1995, pp. 69-87.

(Continued)

*Primary Examiner* — Jarrett J Stark
(74) *Attorney, Agent, or Firm* — Foley & Lardner LLP

(57) ABSTRACT

According to one embodiment, a memory device includes a resistance change memory element including a first electrode, a second electrode, and an intermediate layer provided between the first electrode and the second electrode, containing germanium (Ge), tellurium (Te) and at least one element selected from lithium (Li) and sodium (Na), and at least a part of which being capable of exhibiting a crystalline state.

20 Claims, 2 Drawing Sheets

(56) References Cited

U.S. PATENT DOCUMENTS

| | | | |
|---|---|---|---|
| 2009/0283739 A1 | 11/2009 | Kiyotoshi | |
| 2010/0200828 A1* | 8/2010 | Tominaga | H01L 45/144 257/2 |
| 2011/0227023 A1* | 9/2011 | Bethune | H01L 27/2409 257/4 |
| 2011/0315942 A1* | 12/2011 | Tominaga | H01L 45/065 257/1 |
| 2017/0271580 A1* | 9/2017 | Park | H01L 45/1675 |
| 2017/0271581 A1* | 9/2017 | Seong | H01L 45/1675 |
| 2020/0335692 A1* | 10/2020 | Seong | H01L 27/2427 |

FOREIGN PATENT DOCUMENTS

| | | |
|---|---|---|
| JP | H1-136968 A | 5/1989 |
| JP | H2-243390 A | 9/1990 |
| JP | H2-255378 A | 10/1990 |
| JP | 4254293 B2 | 4/2009 |
| JP | 2009-283486 A | 12/2009 |
| WO | WO-2011/030916 A1 | 3/2011 |

OTHER PUBLICATIONS

B. Eisenmann et al., "LiGeTe$_2$, The First Chain Hypotelluridogermanate", Materials Research Bulletin (vol. 18, No. 10), 1983, pp. 1189-1194 with English translation.

Brigitte Eisenmann et al., "Cyclic [(GeTe$_2$)$_4$Te$_2$]$_{8-}$ Anions in Na$_8$Ge$_4$Te$_{10}$(II)", Zeitschrift für Naturforschung B (vol. 38, No. 8), 1983, pp. 924-929 with English translation.

Shogo Hatayama et al., "Inverse Resistance Change Cr$_2$Ge$_2$Te$_6$-Based PCRAM Enabling Ultralow-Energy Amorphization", ACS Applied Materials & Interfaces (vol. 10, No. 3), Dec. 27, 2017, pp. 2725-2734.

Robin Lefèvre et al., "Layered tellurides: stacking faults induce low thermal conductivity in the new In$_2$Ge$_2$Te$_6$ and thermoelectric properties of related compounds", Journal of Materials Chemistry A (vol. 5, No. 36), 2017, pp. 19406-19415.

Junji Tominaga et al., "Role of Ge Switch in Phase Transition: Approach using Atomically Controlled GeTe/Sb$_2$Te$_3$ Superlattice", Japanese Journal of Applied Physics (vol. 47, No. 7), Jul. 18, 2008, pp. 5763-5766.

* cited by examiner

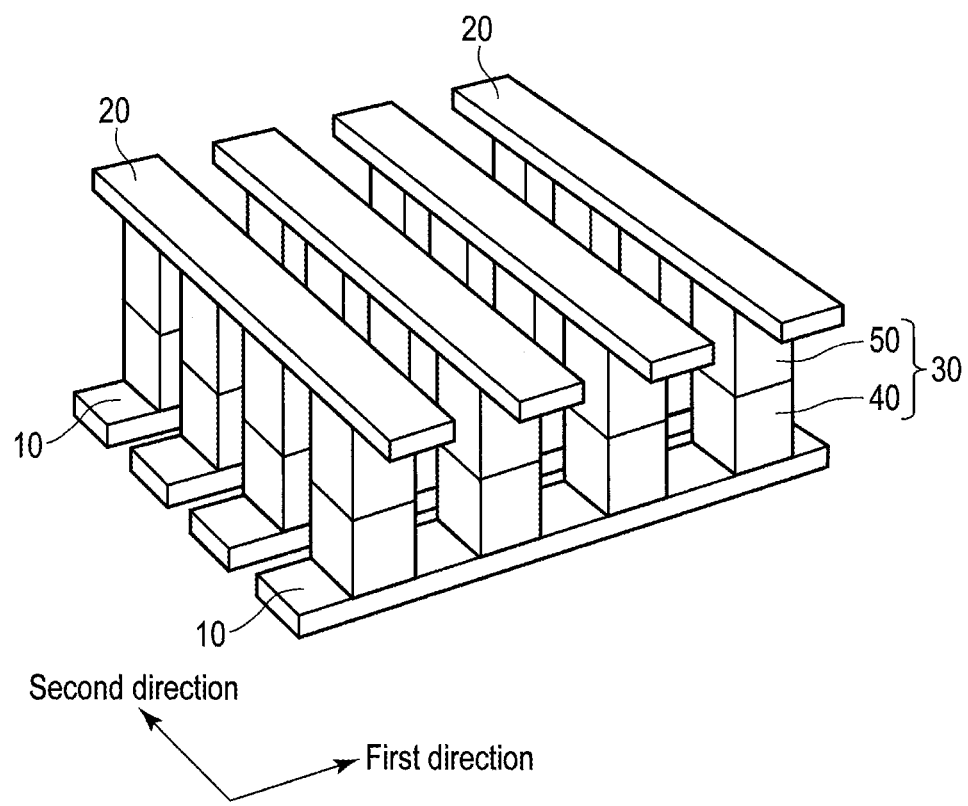
Second direction ← → First direction
F I G. 1
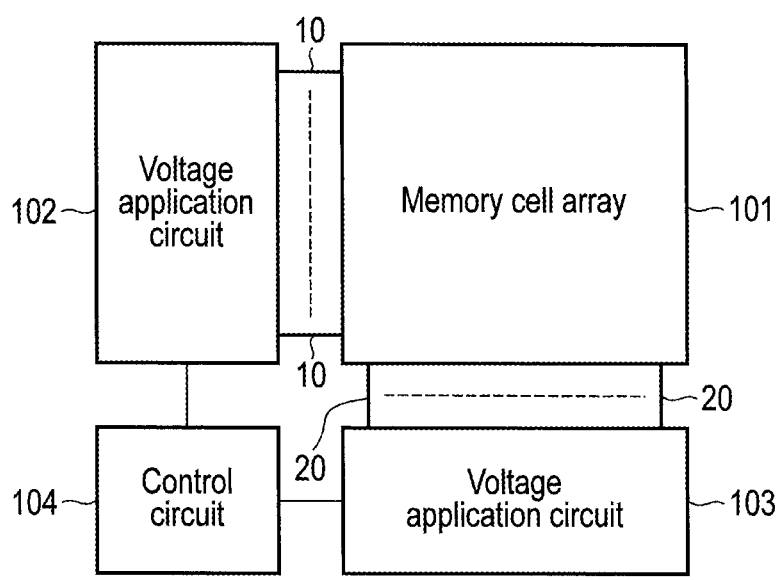
F I G. 2

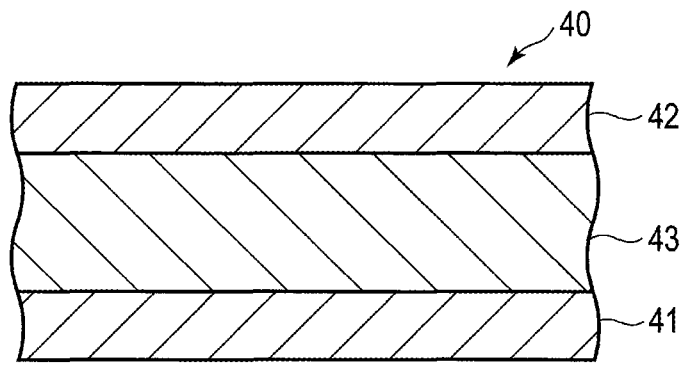
F I G. 3
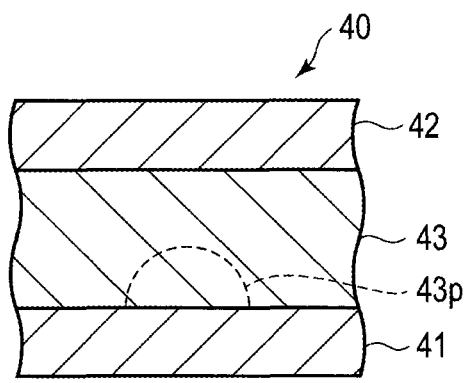
F I G. 4A
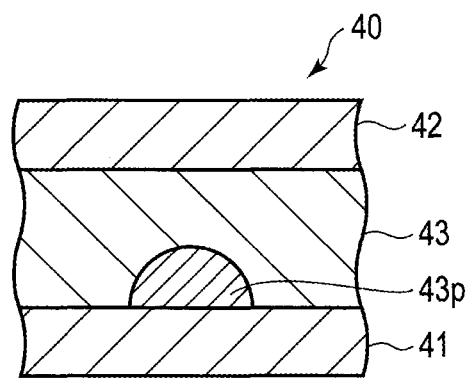
F I G. 4B
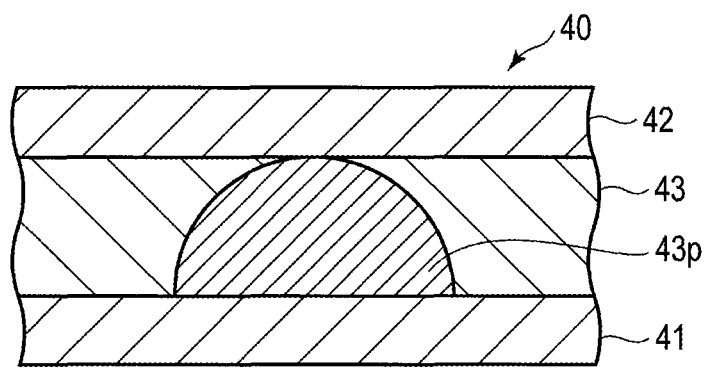
F I G. 5

MEMORY DEVICE

CROSS-REFERENCE TO RELATED APPLICATIONS

This application is based upon and claims the benefit of priority from Japanese Patent Application No. 2019-052230, filed Mar. 20, 2019, the entire contents of which are incorporated herein by reference.

FIELD

Embodiments described herein relate generally to a memory device.

BACKGROUND

Memory devices which employ a phase change memory (PCM) element for the resistance change memory element has been proposed.

However, conventionally, there has not been any memory device proposed, which truly comprise a resistance change memory element of excellent characteristics.

BRIEF DESCRIPTION OF THE DRAWINGS

FIG. 1 is a perspective view schematically showing a structure of a memory device according to an embodiment.

FIG. 2 is a block diagram showing an overall structure of the memory device according to the embodiment.

FIG. 3 is a cross section schematically showing a structure of a resistance change memory element used for the memory device according to the embodiment.

FIG. 4A is a cross section schematically showing a state of an intermediate layer of the resistance change memory element used for the memory device according to the embodiment.

FIG. 4B is a cross section schematically showing a state of the intermediate layer of the resistance change memory element used for the memory device according to the embodiment.

FIG. 5 is a cross section schematically showing a modified example of the state of the intermediate layer of the resistance change memory element used for the memory device according to the embodiment.

DETAILED DESCRIPTION

In general, according to one embodiment, a memory device includes: a resistance change memory element including: a first electrode; a second electrode; and an intermediate layer provided between the first electrode and the second electrode, containing germanium (Ge), tellurium (Te) and at least one element selected from lithium (Li) and sodium (Na), and at least a part of which being capable of exhibiting a crystalline state.

Hereafter, embodiments will now be described with reference to drawings.

FIG. 1 is a perspective view schematically showing a structure of a memory device (semiconductor integrated circuit device) according to an embodiment.

As shown in FIG. 1, the memory device of this embodiment is a crosspoint nonvolatile memory device in which a plurality of memory cells 30 are provided between a plurality of first interconnects 10 and a plurality of second interconnects 20.

The first interconnect 10 each extend along a first direction, and the second interconnects 20 each extend along a second direction. The first interconnects 10 and the second interconnects 20 intersect with each other. More specifically, the first interconnects 10 and the second interconnects 20 intersect with each other at right angles. One group of the first interconnects 10 and the second interconnects 20 corresponds to word lines, and the other group of the first interconnects 10 and the second interconnects 20 corresponds to bit lines.

The memory cells 30 each are connected between a respective first interconnect 10 and a respective second interconnect 20, and contains a resistance change memory element 40 and a selector element 50 connected in series to the resistance change memory element 40. Specifically, each memory cell 30 has s structure that the resistance change memory element 40 and the selector element 50 are stacked in a third direction perpendicular to the first direction as well as to the second direction. Note that in the example shown in FIG. 1, the selector element 50 is stacked on the resistance change memory element 40, but such an inversed structure that the resistance change memory element 40 is stacked on the selector element 50 may be adopted as well.

The resistance change memory element 40 is a nonvolatile memory element, and selectively exhibits a high resistance state (first resistance state) and a low resistance state (second resistance state) where the resistance is lower than that of the high resistance state. Therefore, the resistance change memory element 40 can store binary data (0 or 1) according to the resistance state (the high resistance state or the low resistance state). The resistance change memory element 40 will be described in detail later.

The selector element 50 is configured to select the resistance change memory element 40 connected in series to the selector element 50. In this embodiment, a 2-terminal selector element which has nonlinear current-voltage characteristics is employed as the selector element 50. Specifically, a diode or a 2-terminal switch element containing a chalcogen element can be used for the selector element 50.

The 2-terminal switching element containing a chalcogen element exhibits, when voltage applied between the two terminals is lower than a threshold voltage, the high-resistance state (for example, an electrically non-conductive state). When the voltage applied between the two terminals is higher than the threshold voltage, the 2-terminal switching element is at the low-resistance state (for example, electrically conductive state). The 2-terminal switching element may have the above-described functions in both directions. The switching element contains at least one chalcogen element selected from the group consisting of Te, Se and S. Or it may contain a chalcogenide, which is a compound containing one of the chalcogen elements. Further, the switching element described above may contain at least one element selected from the group consisting of B, Al, Ga, In, C, Si, Ge, Sn, As, P and Sb.

FIG. 2 is a block diagram showing an overall structure of the memory device (semiconductor integrated circuit device) according to the embodiment.

The memory device shown in FIG. 2 includes a memory cell array region 101, a voltage application circuit 102, a voltage application circuit 103 and a control circuit 104. The memory cell array region 101 is a region where a plurality of memory cells 30 shown in FIG. 1 are disposed. The voltage application circuit 102 applies voltage to the first interconnects 10 shown in FIG. 1. The voltage application circuit 103 applies voltage to the second interconnects 20 shown in FIG. 1. The control circuit 104 controls the voltage application circuit 102 and the voltage application circuit 103.

FIG. 3 is a cross section schematically showing a structure of the resistance change memory element 40 employed in the memory device of this embodiment.

As shown in FIG. 3, the resistance change memory element 40 of this embodiment includes a first electrode 41, a second electrode 42 and an intermediate layer 43 provided between the first electrode 41 and the second electrode 42.

The first electrode 41 and the second electrode 42 are formed of a conductive material, for example, a metal material.

The intermediate layer 43 contains germanium (Ge), tellurium (Te) and a predetermined element selected from lithium (Li) and sodium (Na). That is, the intermediate layer 43 is formed of a compound material containing germanium (Ge), tellurium (Te) and a predetermined element selected from lithium (Li) and sodium (Na).

At least a part of the intermediate layer 43 can exhibit a crystalline state. Specifically, at least a part of the intermediate layer 43 selectively exhibits a crystalline state and an amorphous state. For example, at least a part of the intermediate layer 43 selectively exhibits a crystalline state and an amorphous state according to the wave form of write voltage (write current). Specifically, at least a part of the intermediate layer 43 exhibits an amorphous state by large electrical current pulse for a short time period, whereas exhibits a crystalline state by medium electrical current pulse for a relatively long time period.

When at least a part of the intermediate layer 43 exhibits a crystalline state, at least the part of the intermediate layer 43 has a crystal structure of a space group P1- of a triclinic crystal system. Moreover, when at least a part of the intermediate layers 43 exhibits a crystalline state, at least the part of the intermediate layer 43 contains a dimer of germanium (Ge). The dimer of Ge refers to a state where two or more germanium atoms exist in a range of 0.2 to 0.3 nm, and a covalent bond is formed between two Ge atoms.

The ratio in the number of atoms of the predetermined elements contained in the intermediate layer 43 (which corresponds to the composition ratio of the predetermined elements in the compounds which constitute the intermediate layer 43) is in a range of 0.05 to 0.50. The ratio in the number of atoms of germanium (Ge) contained in the intermediate layer 43, (which corresponds to the composition ratio of germanium in the compounds which constitute the intermediate layer 43) is in a range of 0.05 to 0.50. The ratio in the number of atoms of tellurium (Te) contained in the intermediate layer 43 (which corresponds to the composition ratio of tellurium in the compounds which constitute the intermediate layer 43) is in a range of 0.10 to 0.90.

When the predetermined element is lithium (Li), the compound which constitutes the intermediate layer 43 is ideally expressed by $LiGeTe_2$. When the predetermined element is sodium (Na), the compound which constitutes the intermediate layer 43 is ideally expressed by $Na_8Ge_4Te_{10}$.

FIG. 4A is a diagram schematically showing a case where a part 43p of the intermediate layer 43 exhibits a crystalline state, and FIG. 4B schematically shows a case where the part 43p of the intermediate layer 43 exhibits an amorphous state.

The examples shown in FIGS. 4A and 4B illustrate a case where when the part 43p of the intermediate layer 43 exhibits a crystalline state (FIG. 4A), the entire intermediate layer 43 including the part 43p of the intermediate layer 43 exhibits a crystalline state. That is, the entire intermediate layer 43 including the part 43p of the intermediate layer 43 has a crystal structure of the space group P1- of the triclinic crystal system and contains the dimer of germanium (Ge).

When the part 43p of the intermediate layer 43 exhibits an amorphous state (FIG. 4B), the parts other than the part 43p exhibit the crystalline state. That is, the parts other than the part 43p have a crystal structure of the space group P1- of the triclinic crystal system, and contain the dimer of germanium (Ge).

The resistance change memory element 40 of this embodiment exhibits a high resistance state (first resistance state) when at least a part of the intermediate layer 43 is in a crystalline state, and when at least a part of the intermediate layer 43 is in an amorphous state, it exhibits a low resistance state (second resistance state). In the examples shown in FIGS. 4A and 4B, the resistance change memory element 40 exhibits a high resistance state when the part 43p of the intermediate layer 43 is in a crystalline state, and when the part 43p of the intermediate layer 43 is in an amorphous states, it exhibits a low resistance state.

As described above, the resistance change memory element 40 of this embodiment exhibits a high resistance state when at least a part of the intermediate layer 43 is in a crystalline state, and when at least the part of the intermediate layer 43 is in an amorphous state, it exhibits a low resistance state.

Conventional general phase change memory elements (PCM elements) exhibit a low resistance state when the intermediate layer is in a crystalline state, or exhibits a high resistance state when the intermediate layer is in an amorphous state. On the other hand, in the intermediate layer 43 of this embodiment exhibits a low resistance state in an amorphous state and exhibits a high resistance state in a crystalline state.

Next, the reason why such characteristics as described above are obtained by forming the intermediate layer 43 of this embodiment from a compound material containing germanium (Ge), tellurium (Te) and a predetermined element selected from lithium (Li) and sodium (Na).

As described above, general phase change memory elements exhibit a low resistance state when in a crystalline state and a high resistance state when in an amorphous state. A typical known phase change memory element with such characteristics is an element using GeSbTe. In GeSbTe, a dimer of germanium (Ge) exists in an amorphous state (high resistance state). Due to the existence of this Ge dimer, a van der Waals gap is formed between the neighboring tellurium (Te) atoms, GeSbTe is considered to exhibit a high resistance state when in an amorphous state. Therefore, in order to obtain an intermediate layer 43 of a high resistance state, it is considered that the existence of the dimer of germanium (Ge) is important. When the electronic state is actually calculated by density functional method, the results indicate that band gap is closed in the part which contains a bond of Te—Ge—Te—Ge, whereas the band gap is open in the part which contains a bond of Te—Ge—Ge—Te. Thus, it is considered a high resistance state and a low resistance state are distinguished from each other depending on the existence of a Ge—Ge dimer.

In the compound material used in this embodiment, which contains germanium (Ge), tellurium (Te) and a predetermined element selected from lithium (Li) and sodium (Na), a dimer of germanium (Ge) exists in the crystalline state. Therefore, in the compound material of this embodiment, a high resistance state is exhibited when in the crystalline state, and a low resistance state is exhibited when in the amorphous state, and thus it is possible to obtain the intermediate layer 43 with the above-described characteristics. Thus, using the compound material of this embodiment for the intermediate layer 43, it is possible to obtain a resistance change memory element which exhibits a large resistance ratio between a low resistance state and a high resistance state. As a result, a memory device including a resistance change memory element with excellent characteristics can be obtained.

Note that in the embodiment described above, as shown in FIG. 5, when the part 43p of the intermediate layer 43 is in an amorphous state, the part 43p may be in contact with both the first electrode 41 and the second electrode 42.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory device comprising:
a first interconnect;
a second interconnect; and
a memory cell provided between the first interconnect and the second interconnect,
the memory cell comprising:
a resistance change memory element including a layer containing germanium (Ge), tellurium (Te) and at least one element selected from lithium (Li) or sodium (Na), and at least a part of the layer being capable of exhibiting a crystalline state; and
a selector element connected in series to the resistance change memory element, and selecting the resistance change memory element, the selector element being a two-terminal selector element having nonlinear current-voltage characteristics.

2. The memory device of claim 1, wherein
the at least a part of the layer exhibits a state selected from the crystalline state or an amorphous state.

3. The memory device of claim 2, wherein
when the at least a part of the layer exhibits the amorphous state, an other part of the layer exhibits the crystalline state.

4. The memory device of claim 2, wherein
the layer is provided between a first electrode and a second electrode, and
when the at least a part of the layer exhibits the amorphous state, the at least a part of the layer is in contact with one of the first electrode or the second electrode.

5. The memory device of claim 2, wherein
the layer is provided between a first electrode and a second electrode, and
when the at least a part of the layer exhibits the amorphous state, the at least a part of the layer is in contact with both of the first electrode and the second electrode.

6. The memory device of claim 1, wherein
when the at least a part of the layer exhibits the crystalline state, the at least a part of the layer has a crystal structure of a triclinic crystal system.

7. The memory device of claim 1, wherein
when the at least a part of the layer exhibits the crystalline state, the at least a part of the layer contains a dimer of germanium (Ge).

8. The memory device of claim 1, wherein
a ratio in the number of atoms of the at least one element in the layer is in a range of 0.05 to 0.50,
a ratio in the number of atoms of germanium (Ge) in the layer is in a range of 0.05 to 0.50, and
a ratio in the number of atoms of tellurium (Te) in the layer is in a range of 0.10 to 0.90.

9. The memory device of claim 1, wherein
the resistance change memory element exhibits a resistance state selected from a first resistance state and a second resistance state with a resistance lower than a resistance of the first resistance state.

10. The memory device of claim 1, wherein
the at least a part of the layer exhibits a state selected from the crystalline state or an amorphous state, and
the resistance change memory element exhibits a first resistance state when the at least a part of the layer is in the crystalline state, and exhibits a second resistance state with a resistance lower than a resistance of the first resistance state when the at least a part of the layer is in the amorphous state.

11. The memory device of claim 1, wherein
when the layer contains lithium (Li) as the at least one element, a compound contained in the layer is expressed by $LiGeTe_2$.

12. The memory device of claim 1, wherein
when the layer contains sodium (Na) as the at least one element, a compound contained in the layer is expressed by $NaSGe_4Te_{10}$.

13. The memory device of claim 1, wherein
the resistance change memory element and the selector element are stacked.

14. The memory device of claim 1, wherein the selector element is a diode or a two-terminal switch element containing a chalcogen element.

15. A memory device comprising:
a first interconnect;
a second interconnect; and
a memory cell provided between the first interconnect and the second interconnect,
the memory cell comprising:
a resistance change memory element including a layer containing a compound expressed by $LiGeTe_2$; and
a selector element connected in series to the resistance change memory element, and selecting the resistance change memory element, the selector element being a two-terminal selector element having nonlinear current-voltage characteristics.

16. The memory device of claim 15, wherein the compound has a crystal structure of a triclinic crystal system.

17. The memory device of claim 15, wherein the selector element is a diode or a two-terminal switch element containing a chalcogen element.

18. A memory device comprising:
a first interconnect;
a second interconnect; and
a memory cell provided between the first interconnect and the second interconnect,
the memory cell comprising:
a resistance change memory element including a layer containing a compound expressed by $Na_8Ge_4Te_{10}$; and
a selector element connected in series to the resistance change memory element, and selecting the resistance change memory element, the selector element being a two-terminal selector element having nonlinear current-voltage characteristics.

19. The memory device of claim 18, wherein the compound has a crystal structure of a triclinic crystal system.

20. The memory device of claim 18, wherein the selector element is a diode or a two-terminal switch element containing a chalcogen element.

\* \* \* \* \*